(12) United States Patent
Cummings et al.

(10) Patent No.: US 6,467,160 B1
(45) Date of Patent: Oct. 22, 2002

(54) FINE PITCH CIRCUITIZATION WITH UNFILLED PLATED THROUGH HOLES

(75) Inventors: Michael J. Cummings, Vestal, NY (US); Michael V. Longo, Glen Aubrey, NY (US); Curtis L. Miller, Vestal, NY (US); Thomas R. Miller, Endwell, NY (US); Michael Wozniak, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/537,960

(22) Filed: Mar. 28, 2000

(51) Int. Cl.[7] .................................................. H01K 3/10
(52) U.S. Cl. ........................................... 29/831; 29/852
(58) Field of Search .................... 29/852, 825, 830, 29/831, 846; 174/255, 262, 263, 265

(56) References Cited

U.S. PATENT DOCUMENTS

| | | | |
|---|---|---|---|
| 4,383,363 A | | 5/1983 | Hayakawa et al. ............ 29/847 |
| 5,220,135 A | | 6/1993 | Kawakami et al. .......... 174/264 |
| 5,451,721 A | * | 9/1995 | Tsukada et al. .............. 174/261 |
| 5,557,844 A | | 9/1996 | Bhatt et al. .................... 29/852 |
| 5,950,306 A | * | 9/1999 | Suzuki et al. ................. 29/830 |
| 6,079,100 A | * | 6/2000 | Farquhar et al. ............. 174/262 |
| 6,119,335 A | * | 9/2000 | Park et al. ..................... 29/830 |
| 6,195,883 B1 | * | 3/2001 | Bhatt et al. ................... 174/263 |
| 6,211,487 B1 | * | 4/2001 | Hatakeyama et al. .. 219/121.71 |
| 6,291,779 B1 | * | 9/2001 | Lubert et al. ................. 174/262 |
| 6,378,201 B1 | * | 4/2002 | Tsukada et al. .............. 174/265 |

* cited by examiner

Primary Examiner—Timothy V. Eley
Assistant Examiner—David Nguyen
(74) Attorney, Agent, or Firm—William N. Hogg

(57) ABSTRACT

A method of making a circuitized substrate having plated through holes free of filler material is provided. The method includes the steps of providing a dielectric substrate having first and second opposite faces. At least one via hole is formed from one face to the other. A first electrically conductive layer is applied onto the top and bottom faces of the dielectric member and onto the side wall of the via. First layers of photoresist are applied to each layer of conductive material and entering at least partially into the via hole. The first layers of photoresist are selectively exposed and developed to remove all of the photoresist, except that photoresist which is disposed in the via holes. Thereafter, a portion of the faces of the metal coatings on the surfaces of dielectric material and any photoresist remaining in the holes extending above the layers of electrically conductive material are removed to form a planar surface thinner than the thickness of the metal in the through hole. Thereafter, a second layer of photoresist material is applied to both the surfaces of the metal on both faces of the dielectric material and exposed to a desired circuit pattern. Thereafter, the second layers of the photoresist material are developed to reveal the underlying metal which is then etched to form a circuit pattern in the metal layer on both faces. Thereafter, the second layers of the remaining photoresist are stripped and also the photoresist remaining in the hole is stripped, thereby to provide a circuitized substrate with plated through holes having an opening extending from the upper face of the substrate to the lower face of the substrate.

13 Claims, 4 Drawing Sheets

FINE PITCH CIRCUITIZATION WITH UNFILLED PLATED THROUGH HOLES

FIELD OF THE INVENTION

This invention relates generally to a method of forming a high performance printed wiring circuit board structure having high circuit density per unit area and, more particularly, to a method of forming such a high performance printed wiring circuit board structure having plated through holes which are unfilled and extend from one surface of the board to the other.

BACKGROUND OF THE INVENTION

With the recent trend toward reduced sizes in electronic components and the resulting high density requirements for electronic packaging, such as printed wiring board structures, there have been increased demands to design a process that will generate high quality, high density printed wiring boards efficiently, wherein there are unfilled plated through holes.

The need for high density electronic devices, such as very large scale integrated circuits (VLSIs) has greatly increased. The space or area available outside of the VLSI in which to make the large number of necessary connections to and from it and to provide the necessary circuitry is becoming very small as measured by previous standards. Contrary to the density increase in the VLSIs, the density of the passive circuits on printed wiring boards has increased (i.e., the parts have decreased in size) by only a relatively small factor (i.e., less than about 4 to 1). This presents the difficulty of providing circuitry on the printed wiring board to the VLSIs which is small enough to fit the spaces available and which is also sufficiently reliable and readily manufacturable to be economically useful.

One of the most significant limitations on creating high density fine line circuitry on printed wiring boards is the generally known problem of trying to obtain anisotropic etching. It is known that etching metals, especially copper metal, is not an anisotropic process. That is, vertical etching is not feasible without some amount of unwanted horizontal etching. This creates a situation in which the features and circuitry so formed can be severely undercut, leading to different types of failures and reject material. In other words, this presents a limitation on the type of electrical circuitry that can be formed by the subtractive etching process. The problem is exacerbated by having thick metal layers. However, this is precisely the situation that is created when standard vias or through holes are part of the manufacturing process.

It is well known that the plating within a through hole is thinner than the plating on the external surface; yet a minimum thickness in the through hole is required in order to provide an adequate and reliable electrical connection between the circuitry on the opposing faces or at various levels within the printed wiring board. Therefore, the general practice is to plate excess material on the lateral faces in order to insure sufficient plating of the through holes. The effect of this is that a greater than necessary thickness of the lateral surface plating then causes greater amounts of undercutting during the circuitization process by etching. To compensate for this effect, the circuitry lines are designed wider and farther apart than otherwise required or desired. To resolve this problem, thinning down of the lateral faces by etching, prior to circuitization, has been suggested. If chemically performed, this process also undesirably etches within the plated through holes which negates obtaining the required thickness of the plated through holes. Mechanical etching of the lateral surfaces is possible but general practice for a process of this type is extremely slow.

The area of printed wiring board manufacturing most affected by these advances in technology are the relatively thick processor or backpanel type boards. These boards vary in thickness based upon the application from about 40 mils to greater than 400 mils. Because of the thickness of these boards and the aforementioned difficulties with plating and etching, final assembly of the finished functional product often includes compliant pin connectors for card insertion, harcon pin insertions for MCM modules or surface mount components. Current advances in technology are permitting the direct attachment of chips (DCA) to large panels, as well as solder ball arrays (land grid areas or ball grid arrays as an example), for direct attachment of MCM's.

The deficiencies in the current art limit the circuitization of features needed to direct attachment of assemblies components other than surface mount discrete components. A standard print and etch method of fabrication is limited by the aforementioned thickness of surface copper being etched to produce the features. Pattern plating operations, either electroplating or full build, are limited by the photoresist resolution in the fine areas. This is because one mil of plating is still required in the plated through holes, resulting in the use of a minimum one mil thick pattern plating photoresist. As photoresist thicknesses increase, the ability to resolve finer lines and spaces is limited.

Also, another deficiency of the current art is the ability of the thin photoresists to tent plated through holes (PTH) to protect them from etching during the circuitization process. Printed wiring boards needing pinned components require relatively larger diameter holes (30 mils and up) than thinner boards where small vias are used for wiring through the board. This invention aids the circuitization by providing a temporary support for the photoresist over the relatively large holes.

Hayakawa et al, in U.S. Pat. No. 4,383,363, teach the use of conductive materials for filling through holes, but no mention is made of non-conductive materials for this application. Hayakawa et al do not disclose the significance of a thin metallic layer for creating high density circuitry. The purpose of the conductive filling in their invention is solely to electrically connect the two major faces of the substrate, not to protect the metal layer in the through hole, as in the present invention.

Kawakami et al, in U.S. Pat. No. 5,220,135, disclose a conductive filling within the through hole of an insulative substrate. As in U.S. Pat. No. 4,383,363, supra, no mention is made of protecting the metal layer within the plated through hole.

Bhatt et al, in U.S. Pat. Nos. 5,557,844 and 5,487,218, disclose a process and a material for forming filled through holes and blind holes. The filler material is an organic polymeric material optionally with particulate filler. The filler composition is compounded to have a coefficient of thermal expansion matching the coefficient of thermal expansion of the dielectric substrate. The fill material may be either conductive or non-conductive. These patents teach first laminating a copper foil to a dielectric substrate followed by thinning the foil to an acceptable thickness, then drilling through holes and subsequently electroless plating into the through holes to create a conductive layer therein. The filling in the '844 patent occurs after the etching process of the lateral metal layers, unless the present invention which requires that the filler be present during the etching process. Furthermore, the specific benefit of the present invention is that both the lateral metallic layers and the through hole metal layer are applied simultaneously, unlike the '844 disclosure, which specifies that these steps occur sequentially.

One attempt to solve this problem is shown and described in U.S. patent application Ser. No. 09/345,573, filed Jun. 30, 1999, entitled "Fine Pitch Circuitization with Filled Plated Through Holes" (Attorney Docket EN9-98-113). This solution is effective for many different applications. However, it does have limitations for certain applications. Specifically, when the circuitized structure is used for a pin in hole connection, the fillings in the hole prevent the pins from entering the holes and making the required connections. Thus, for pin in hole connection, through holes need to be free of filling material to allow the pins to enter the openings. Moreover, in some instances, the filler material used may tend to interfere with the various subsequent processing steps of the circuitized substrate.

Therefore, it is a principal object of the present invention to provide an improved process of forming a circuitized substructure, resulting in plated through holes free of filler material in the final product.

SUMMARY OF THE INVENTION

According to the present invention, there is provided a method of making a circuitized substrate having plated through holes free of filler material. The method comprises the steps of providing a dielectric substrate having first and second opposite faces. At least one via hole is formed, extending from one face to the other. A first electrically conductive layer is applied onto the top and bottom faces of the dielectric member and onto the side wall of the via. First layers of photoresist are applied to each layer of conductive material and forced at least partially into the via hole. Thereafter, the first layers of photoresist are selectively exposed and developed to remove all of the photoresist, except that photoresist which is disposed in the via holes. Thereafter, a portion of the faces of the metal coatings on the surfaces of dielectric material and any photoresist remaining in the holes which extends above the layers of electrically conductive material are removed to form a planar surface of a thickness thinner than the thickness of the metal in the through hole. Thereafter, a second layer of photoresist material is applied to both the surfaces of the metal on both faces of the dielectric material and exposed to a desired circuit pattern. Thereafter, the second layers of the photoresist material are developed to reveal the underlying metal which is then etched to form a circuit pattern of said metal layer on both faces. Thereafter, the second layers of the remaining photoresist are stripped and also the photoresist remaining in the holes is stripped, thereby to provide a circuitized substrate with plated through holes having openings extending from the upper face of the substrate to the lower face of the substrate.

DETAILED DESCRIPTION OF THE PREFERRED EMBODIMENT

For a better understanding of the present invention, together with other and further objects, advantages and capabilities thereof, reference is made to the following disclosure and appended claims in connection with the above described drawings.

The invention defines a method of making a circuitized substrate and the printed wiring board (PWB) in which the PWB is particularly designed to accommodate a variety of assembled components on the same substrate. The PWB produced in accordance with the teachings herein is capable of: (1) exhibiting relatively high electrical signal propagation speeds; (2) accommodating relatively high I/O single and multi-chip modules; (3) avoiding the need for multiple manufacturing setup operations heretofore associated with high I/O pinned components thereby achieving a relatively short "time of flight" for electrical signals propagating through the package by permitting the direct attachment to the PWB; and (4) assuring a relatively high rate of heat dissipation. In particular, the PWB produced in accordance with the preferred method taught herein achieves relatively high electrical propagation speeds because it employs organic materials, such as fiberglass-reinforced epoxy resins (in the trade also referred to as "FR4" or "BT"), in lieu of ceramic materials. The resulting PWB also accommodates relatively high I/O count chips because it uses direct attachment of SCM's or MCM's to fan-out circuitry on the board. The resulting package achieves a relatively short "time of flight" for electrical signals.

Figure 1:
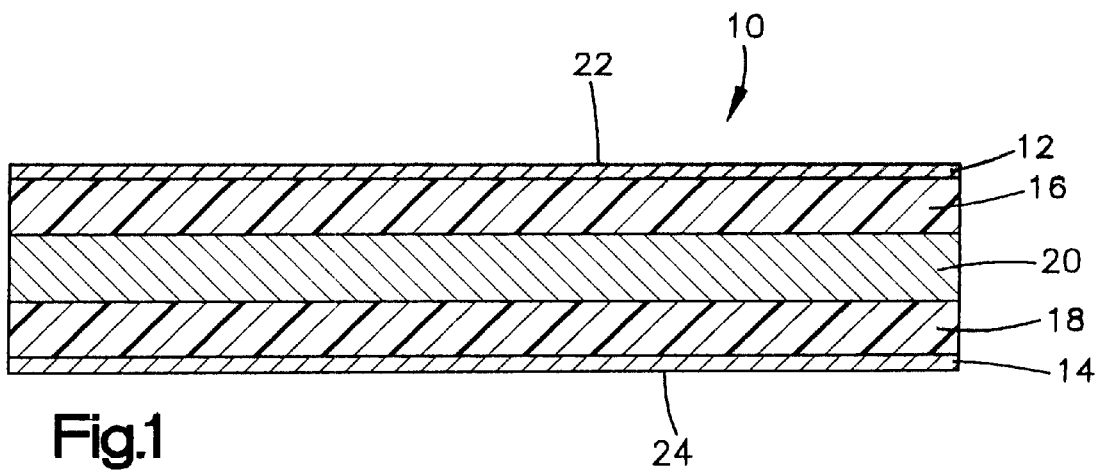
FIG. 1 is a longitudinal, sectional view of a printed wiring board showing the first step in forming the board.

In FIG. 1, there is shown an electrically insulative base member 10 which may be used in the present invention to produce a PWB product (described below). It is understood that the invention is not limited to the particular configuration shown in FIG. 1, as others are readily possible. Base member 10 includes first and second conductive layers 12 and 14, which sandwich therebetween first and second dielectric layers 16 and 18 and conductive plane 20. In a preferred embodiment, each of the two conductive layers 12 and 14 is comprised of copper or other well known conductive material, each having a thickness from about 0.25 mils (0.0025 inches) to about 1.5 mils with the thickness of each preferably being about 0.25 mils. Each of the two dielectric layers is comprised of fiberglass reinforced epoxy resin (FR4) and each possesses a thickness of from about 2 mils to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

The conductive plane 20, preferably of copper or other well-known conductive material, has a thickness of preferably within the range of about 0.125 mils to about 2.5 mils. The thicknesses for plane 20 of less than about 0.125 mils may prove undesirable should the resulting structure be subjected to relatively high temperatures. Additionally, thicknesses greater than about 2.5 mils may prove undesirable because of the additional time necessary to form such layers using conventional platting techniques and associated difficulties with line width control.

It is understood that base member 10 could represent a thick multi-layer printed wiring board as well. An example of such a structure includes multiple layers of dielectric material 16 and 18 as well as conductive planes 20. Each of the multiple layers could have corresponding layers 12 and 14 for internal circuitization as well as additional small wiring vias inside the structure.

The resulting structure shown in FIG. 1 thus preferably processes a thickness within the range of about 4.7 mils to about 400 mils. Structures below 40 mils are often used for PCMIA or chip carrier applications. It is difficult and not generally practiced to use pinned components for these type structures. However, this invention can be used for protecting alignment or tooling holes. Structures greater than 40 mils are able to support pinned components. Structures over 100 mils in thickness are generally used for processor or backpanel assemblies where multiple signal/ground/power layers are required. Structures over 400 miles are rare due to the improvements in dielectric materials, circuitization, build-up layers and, more generally, tool limitation in PWB factories.

Conductive layers 12 and 14 and dielectric layers 16 and 18 are bonded to the conductive plane 20 using a lamination process. Such a process is known in the art and further description is not believed necessary. This process is also used for formulation of the thick multilayer boards. Base member 10 is, thus, shown to include at least two surfaces, a first surface 22, and a second surface 24. It is understood that the surfaces 22 and 24 represent the exterior of most surfaces of the member, in the event a multilayer board is used.

Although two conductive layers and two dielectric layers are shown for base member 10, it is understood that the invention is not limited thereto. Specifically, it is only necessary to provide one such conductive layer and one such dielectric layer while still attaining the advantageous results taught herein. At least two layers of each are used when it is desired to incorporate an internal conductive plane (e.g., power, ground or signal) as part of the final structure. Understandably, several conductive dielectric layers and corresponding internal conductive planes may be utilized, depending on operational requirements for the finished product.

Figure 2:
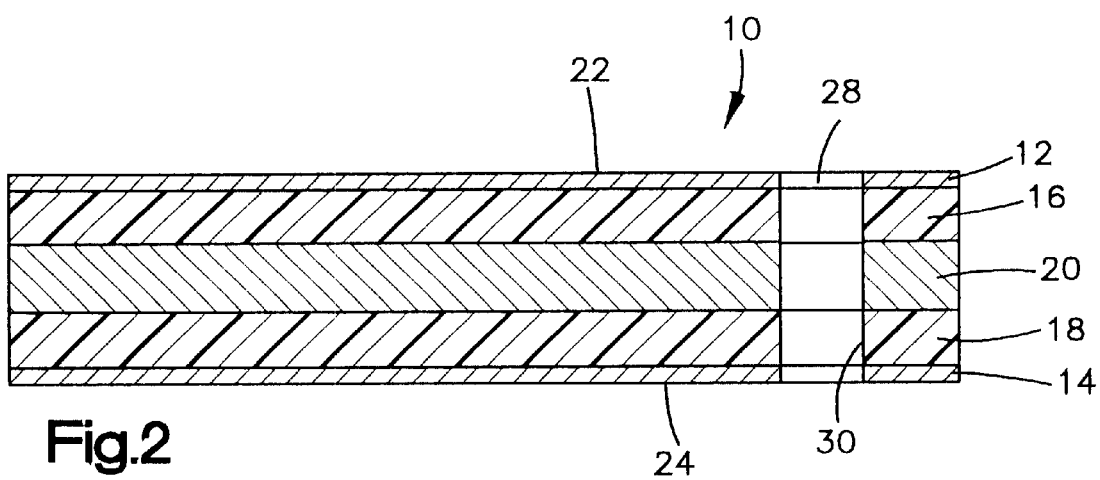
FIG. 2 is a longitudinal sectional view of the board shown in FIG. 1, further comprising a via formed therein.

Referring now to FIG. 2, opening or through hole 28 is provided which extends from the first metal surface 22 to the second metal surface 24. The opening 28 has a side wall 30. Although only one opening 28 is shown in the base member 10, it is to be understood that multiple openings may be formed in the base member 10 depending upon the ultimate electrical requirements of the circuitized structure. The opening 28 may preferably be formed by mechanical drilling, although other hole forming techniques, such as punching and laser drilling, may be employed. The opening 28 is formed with a diameter suitable for its use in the boards. Diameters of about 6 mils to about 18 mils are used for wiring vias, about 20 to 50 mils for pinned components, and up to 250 mils for tooling, fixturing or alignment holes.

Figure 3:
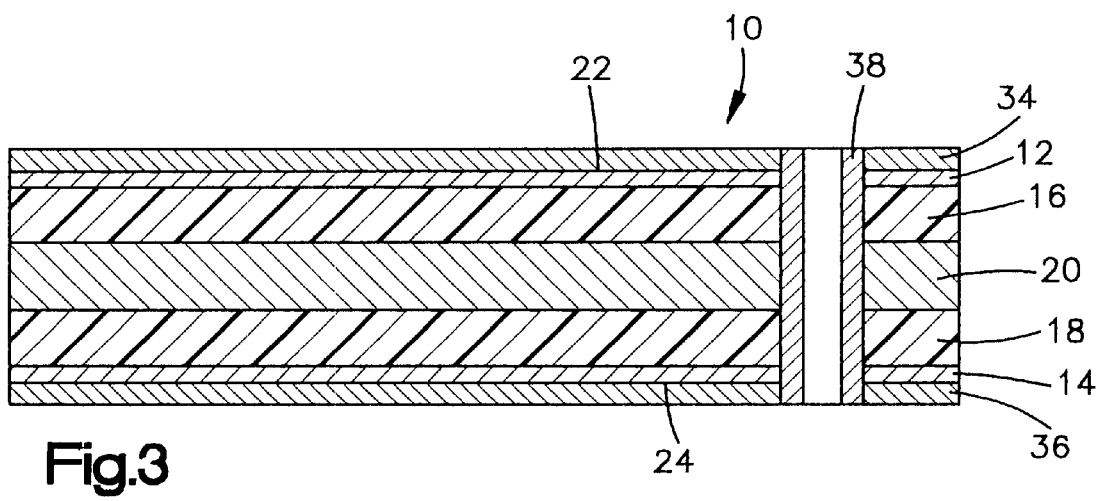
FIG. 3 is a longitudinal, sectional view of the board as shown in FIG. 2 wherein the via and both external layers have been overplated with a metal layer.

In the next step, as shown in FIG. 3, a metal layer 34 is provided on the metal surface 22 and a metal layer 36 is provided on metal surface 24. Preferably, the metal layers 34 and 36 are copper, although other conducting materials can be used, such as nickel or aluminum. The thickness of the metal layers 34 and 36 preferably is from about 0.3 mil to about 1.5 mils and, more preferably, about 0.9 mil to about 1.2 mils. Metal layers 34 and 36 preferably are deposited by conventional plating methods, such as electroplating, electroless plating, sputter, mag-ion or other well known techniques. These methods may employ the use of electrically conductive layers (having a thickness of 10 to 60 angstroms, such as a seed layer comprising particles of palladium-tin particles to act as a catalyst for metal deposition.

This is especially required in the opening 28 to provide a base on which to electro or electrolessly plate metal layer 38. The techniques for such plating are well known in the art and need not be described in detail.

After application of the metal layers 34 and 36 and the metal layer 38 on the wall 30, the diameter of the opening 28 is reduced by the twice thickness of metal plated on the hole all 30. For the preferred plating thickness of 0.9 to 1.2 mils, wiring via diameters are reduced form about 6–18 mils to 4–16 mils and likewise with the larger via sizes for pinned component and alignment holes. However, the metal layer 38 on the wall 30 is thinner than the total thickness of the metal layers 34 and 12 and also thinner than the total thickness of metal layers 36 and 14. This is a result of conventional electroplating processes which deposit a greater vertical height to the conductive layers 12 and 14 than to the thickness of the metal 38 in the opening 28. However, this poses a problem for creating fine line circuitization. As the thickness of the metal layers on the opposite faces increases, it becomes increasingly difficult to create circuit traces of a fine pitch, i.e. circuit traces being relatively narrow. It is, therefore, desirable to keep the layers of metal on the opposite faces of the substrate 10 as thin as possible, while keeping the metal wall 38 as thick as possible. Thus, the following is a description of the process to accomplish this. It describes how the thickness of the metal layers 34 and 12 and metal layers 36 and 14 can be reduced substantially while maintaining the thickness of the metal 38 on the wall 30 and still result in a plated through hole which is free of filler material. To this end, the process as described with respect to FIGS. 4–11 achieves this result.

Figure 4:
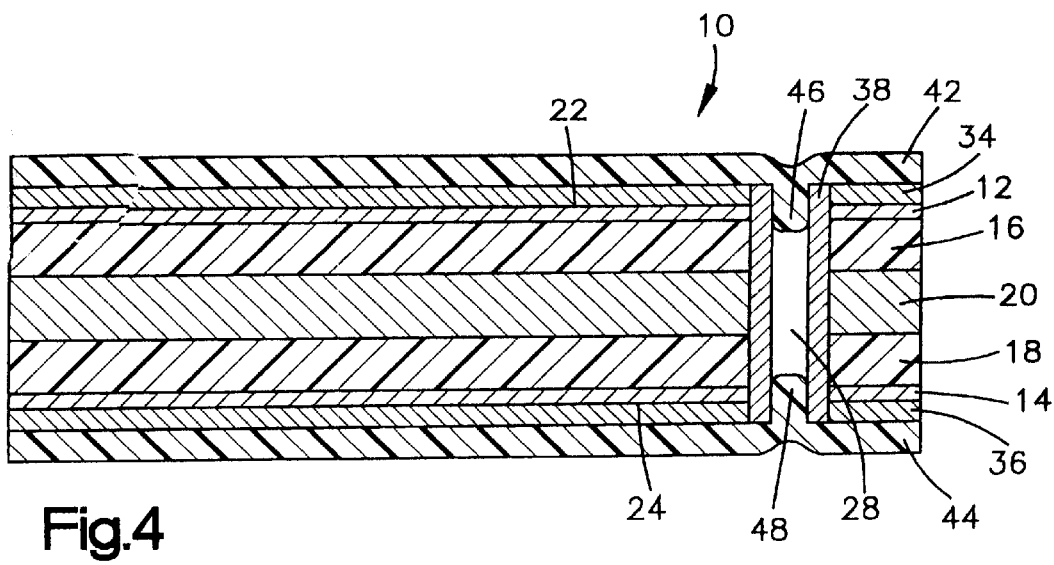
FIG. 4 is a longitudinal, sectional view of a printed wiring board as shown in FIG. 3, with photoresist applied to the metal on both faces of the dielectric substrate.

Referring now to FIG. 4, a first layer of photoresist material 42 is applied on the surface of the metal layer 34 and a first layer of photoresist material 44 is applied on the surface of the metal layer 36. While various types of photoresist may be used, one preferred dry film photoresist is sold by duPont as duPont 4830. This is a negative acting photoresist. This film should not be more than about 3 mils thick. The photoresist layers 42 and 44 are applied by a lamination or vacuum process. The process forces a certain amount of the photoresist 42 into the hole 28 adjacent the metal layer 34 as plug 46 and a certain amount of the photoresist 44 into the opening 28 adjacent the metal layer 36 as plug 48. The plugs 46 and 48 should extend into the holes 28, a distance farther than the amounts of the surface of the layers 34 and 36 that are to be removed, as will be described presently.

Figure 4A:
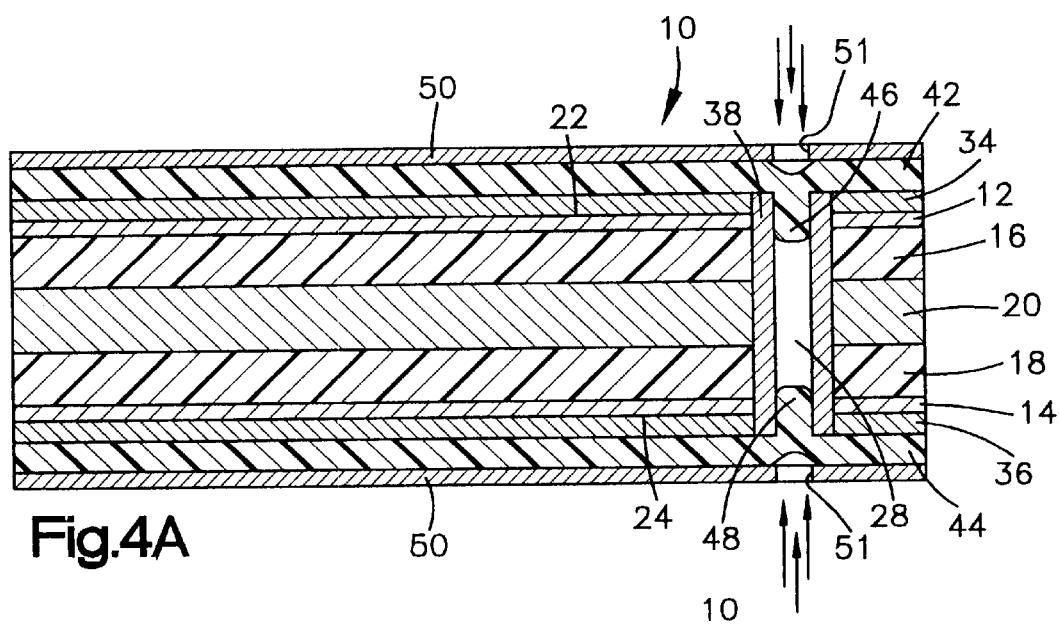
FIG. 4A is a longitudinal, sectional view of a printed wiring board shown in FIG. 4, showing the exposure of the photoresist through a mask.
Figure 5:
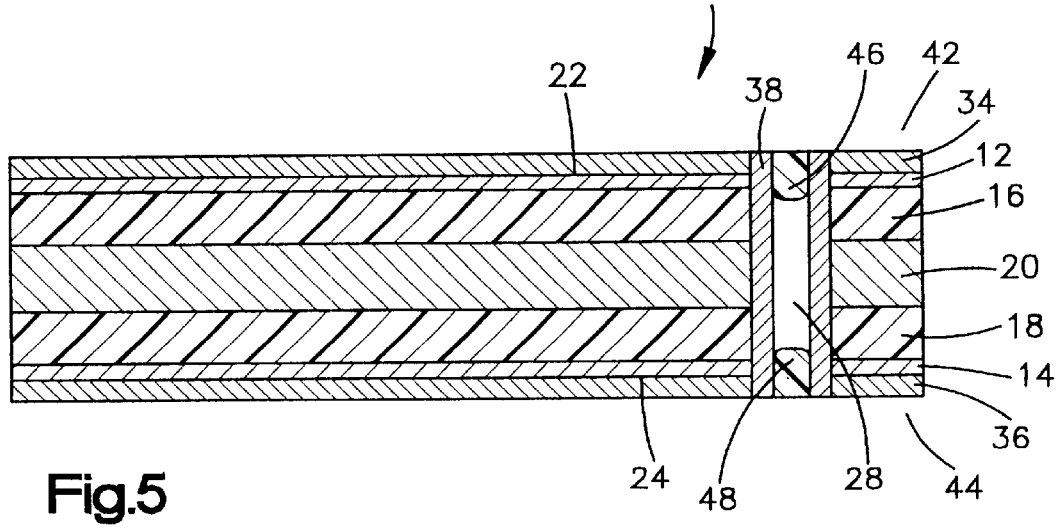
FIG. 5 is a longitudinal, sectional view of a printed wiring board as shown in FIG. 4, with the photoresist exposed and developed where the metal is to be removed.

As seen in FIG. 4A, the layers of photoresist 42 and 44 are exposed through masks 50 having opening 51 to expose the photoresist plugs 46 and 48 to actinic radiation (preferably, this is U.V. radiation) and to mask the remainder of the photoresist 42 and 44 from such radiation. The layers of photoresist 42 and 44 are then developed to reveal the underlying metal layers 34 and 36, respectively, with the plugs of the resist 46 and 48 still disposed in the opening 38 since the exposure of these plugs has resulted in their remaining as shown in FIG. 5.

Figure 6:
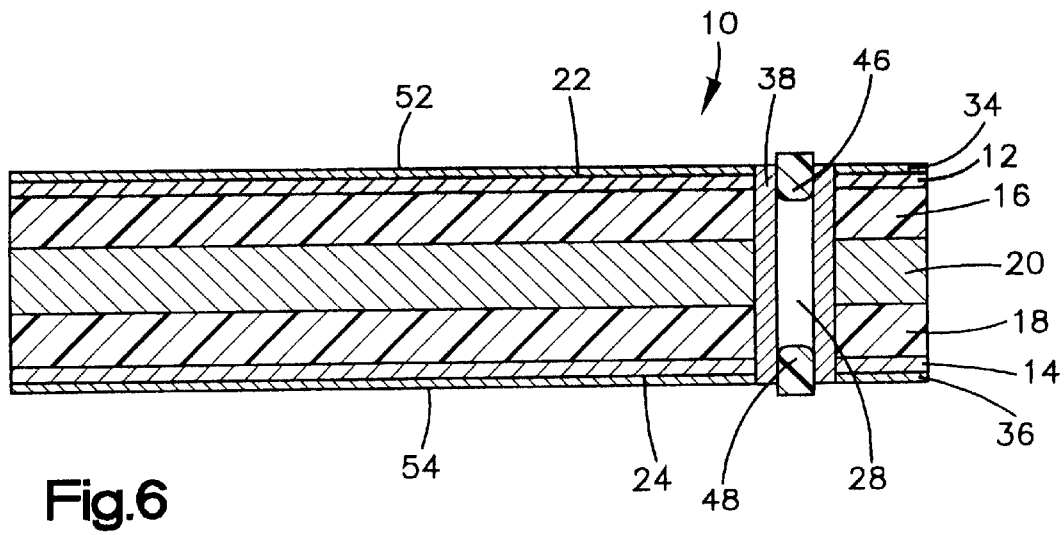
FIG. 6 is a longitudinal, sectional view of a printed wiring board of FIG. 5, with the metal surfaces on the faces of the dielectric thinned to the desired thickness.

The metal layers 34 and 36 are then substantially thinned as shown in FIG. 6 to provide opposed surfaces 52 and 54. In the described embodiment, the thickness is reduced to about 0.1 to 0.8 mil. The preferred final thickness of the combined layers of 34 and 38 (also 22 and 24) on the first and second layers is 0.3 to 1.0 mils. Indeed, it is possible that this thinning can remove the entire metal layers 34 and 36 and thin down the electrically conductive layers 12 and 14 to the desired thickness. Although it is possible to perform the etching step through a multiple pass mechanical grinding operation, the preferred method is a chemical etch. The plugs 46, 48 of unremoved photoresist prevent the etching of the material 38 on wall 30 of hole 28. The chemical etch can be any known method that will etch the metal used for the conductive layers 34, 36, 12 and 14. In the case of copper, preferably a cupric chloride solution is used. Other methods could include cold etching sodium persulfate, ammoniacal etch, etc. The tool configuration should be optimized to provide a uniform thinning down of the conductive layers. Typically, this is performed through a conveyor speed or flow nozzle adjustment. As can be seen in FIG. 6 after the thinning has taken place by chemical etching, the plugs 46 and 48 project above the final surfaces 52 and 54 of the electrically conductive layers where, as noted above, the plugs 46 and 48 prevent the etching of the metal 38 on the wall 30 of the holes 28, thus maintaining this plated structure relatively thick as is desired while allowing a thinner structure to be formed on the two faces of the dielectric material.

Figure 7:
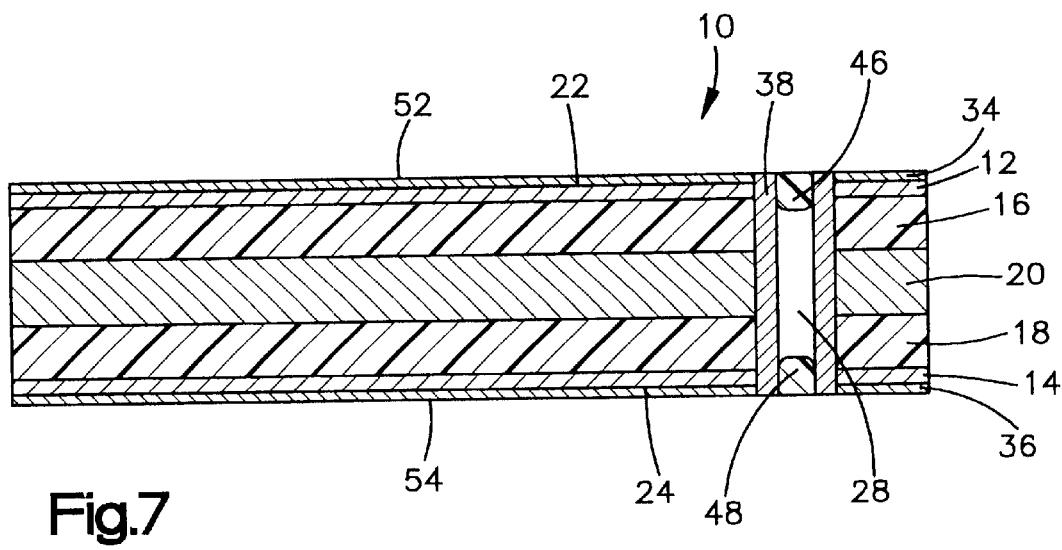
FIG. 7 is a longitudinal, sectional view of the printed wiring board as shown in FIG. 6 with the photoresist in the holes flattened to provide a planar surface on the metals on both faces of the dielectric substrate.

Following the thinning of the metal surfaces, the nubs of the plugs 46 and 48 are planarized to be coplanar with the thinned metal surfaces 52 and 54 as shown in FIG. 7. Following this, the two sides of the base member 10 are circuitized, as will be described.

Figure 8:
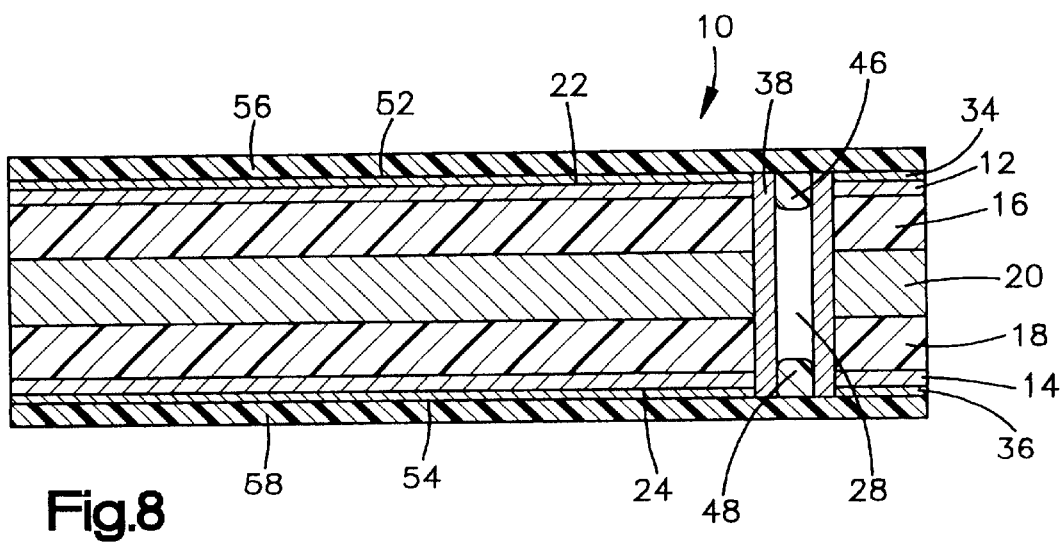
FIG. 8 is a longitudinal, sectional view of the printed wiring board as shown in FIG. 7, with second layers of photoresist applied to the metal on both faces of the substrate.

Referring now to FIG. 8, second layers of photoresist 56 and 58 are applied to the reduced metal surfaces 52 and 54, respectively. This photoresist can be either liquid or dry film, preferably it is a dry film MacDermid MI, or dry film duPont 3120 photoresist. The thickness of each photoresist layer should be 1 mil or less and preferably about 0.2 mil. The photoresist is then exposed through a mask (not shown) and developed to reveal a pattern on the surfaces 52 and 54 in a conventional manner for the desired circuitry, with the developed photoresist being removed to reveal the underlying copper which is to be etched away, as shown in FIG. 9.

Figure 9:
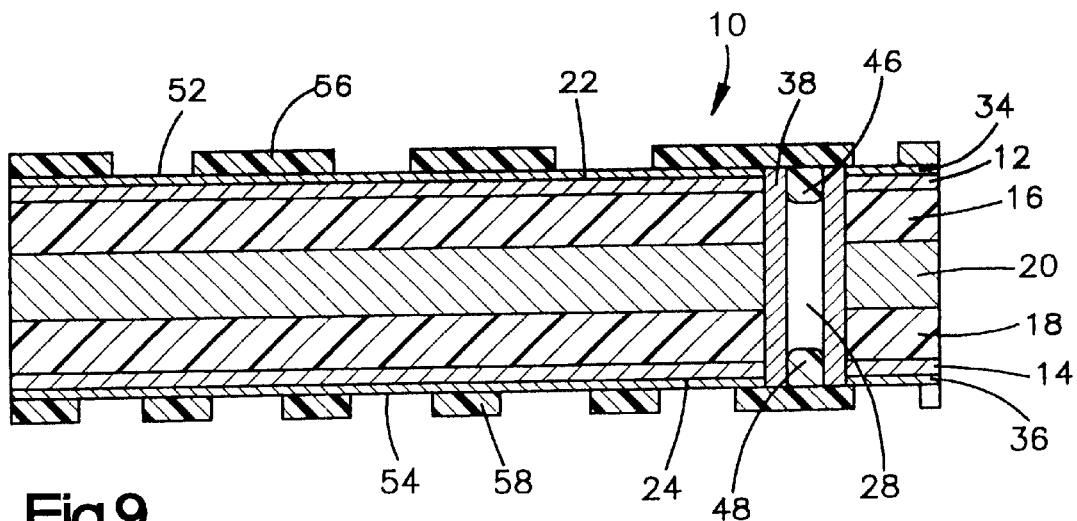
FIG. 9 is a longitudinal, sectional view of a printed wiring board as shown in FIG. 8, with the second layers of photoresist thereon exposed and developed to reveal the metal underneath to be etched away to form the circuitry.
Figure 10:
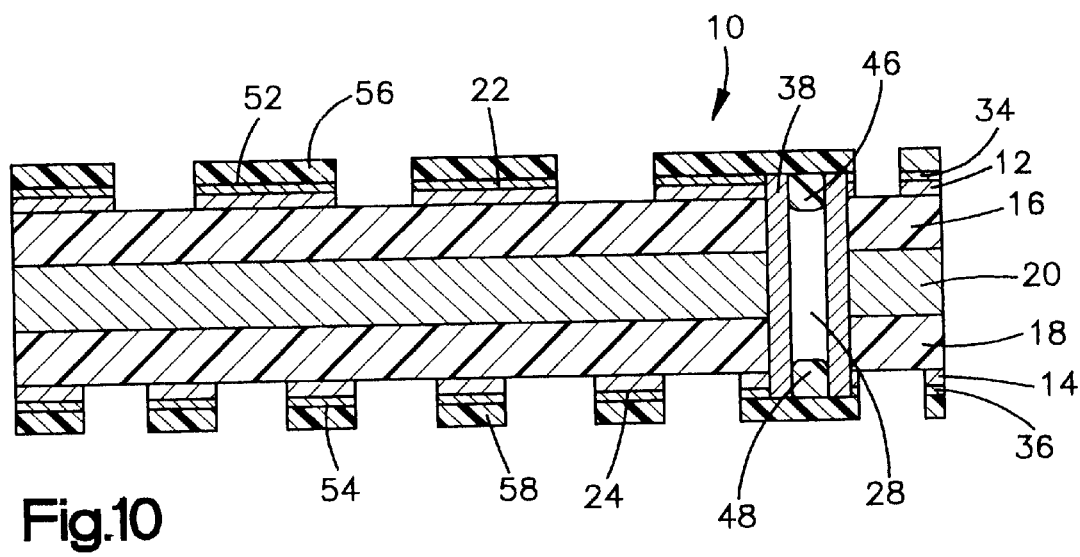
FIG. 10 is a longitudinal, sectional view of a printed wiring board as shown in FIG. 9 with the exposed metal etched.
Figure 11:
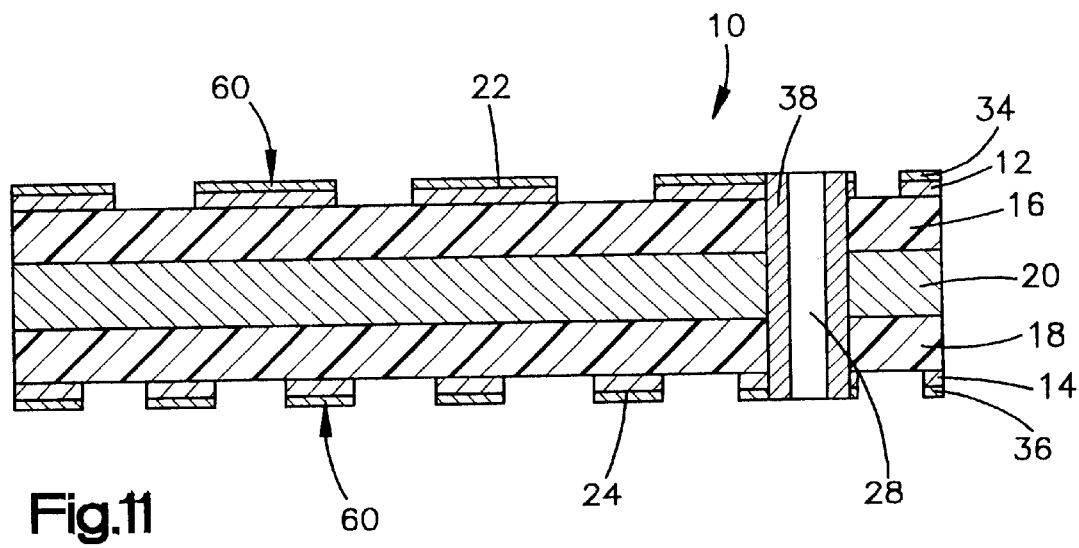
FIG. 11 is a longitudinal, sectional view of the printed wiring board as shown in FIG. 10, with all of the remaining photoresist stripped to provide a circuitized circuit board with plated through holes free of filler material.

The underlying copper which has been revealed by exposing developing of the photoresist, as shown in FIG. 9, is etched as shown in FIG. 10. Following the etching of the copper which is done in conventional manner, the remaining photoresist is stripped in the conventional stripper for photoresist which can be removed, preferably by stripping the photoresist with a suitable solvent known in the art, such as propylene carbonate, benzyl alcohol, sodium carbonate or sodium hydroxide. Other removal techniques, such as laser ablation and mechanical removal or combinations thereof, may also be employed to remove the photoresist layer. This will remove not only the photoresist 56 and 58 remaining over the circuitized lines but also will remove the plugs of photoresist 46 and 48 in the opening 28 to provide the circuit structure designated generally as 60 on both sides of the base member 10, as shown in FIG. 11. This circuit structure is essentially a very fine line circuit structure on opposite faces of the dielectric materials 16 and 18, with relatively thicker metal walls 38 forming the plated through holes.

Thus, the structure formed by the method of the present invention provides plated through holes which are free of any filler material, thus allowing a fine-line printed wiring structure that can be used to join to a pin in hole structure on an underlying circuit board. Also, the material that was used in the holes 28 to protect the side wall 38 in the holes from being thinned during thinning of the surface conductive material has been removed so that it will not interfere with subsequent processing of the circuit board.

Accordingly, the preferred embodiment(s) of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of manufacturing a printed wiring board structure comprising the steps of:

a. providing a dielectric substrate having upper and lower faces and at least one through hole extending from said upper face to said lower face, said through hole having a wall within the dielectric substrate, and a continuous metal coating covering said upper and lower faces and said wall of said through hole;

b. therafter applying first layers of photoresist material to the metal coating on both faces of said dielectric substrate and in at least a portion of the hole;

c. thereafter selectively exposing said first layers of photoresist material on both faces;

d. thereafter developing the exposed first layers of photoresist to remove all of the photoresist except that exposed in said hole;

e. thereafter removing a portion of the thickness of the metal coatings on the faces of said dielectric material, and removing any photoresist material which extends past the surfaces of the metal coating on each face after removal of a portion of the metal coating;

f. applying second layers of photoresist material to the faces of the metal on both faces of said dielectric material and exposing said second layers of photoresist material to provide desired circuit patterns on the underlying layers of material;

g. developing said second layers of photoresist material to reveal the underlying metal to be etched to form a circuit pattern of said metal layers on both of said faces;

h. thereafter removing the revealed metal; and i. thereafter stripping the photoresist of said second layers of photoresist material on said metal faces and also said photoresist materials in said holes to thereby provide a circuitized substrate with plated through holes having openings free of filler material extending from the upper face of said substrate to the lower face of said substrate.

2. The method as defined in claim 1 wherein the photoresist of said second layer is stripped by chemical composition.

3. The method as defined in claim 1 wherein said continuous coating on the upper and lower faces of said dielectric is copper.

4. The method as defined in claim 1 wherein said first layers of photoresist are negative acting photoresist.

5. The method as defined in claim 1 wherein the revealed metal in step g is removed by etching in step h.

6. The method as defined in claim 1 wherein said hole is essentially cylindrical.

7. The method as defined in claim 1 wherein said portions of said thickness of said metal coatings is removed prior to removal of the photoresist material which extends past the surface of said metal coatings in step e thereof.

8. The method as defined in claim 7 wherein said portion of said thickness of said metal coatings is removed at least in part by chemical etching.

9. The method as defined in claim 1 wherein said continuous metal coating on said upper face and said continuous metal coating on said lower face are each formed of at least two layers of metal.

10. The method as defined in claim 9 wherein said portion of said thickness of said metal coatings includes all of said first layer of each coating when removed in step e of claim 1.

11. The method as defined in claim 10 wherein one of said two layers of metal forming said continuous coating is chemically deposited.

12. The method as defined in claim 11 wherein the deposition of said one layer is by electro-deposition.

13. The method as defined in claim 11 wherein said electro-deposition of said one layer is also deposited with the metal coating on said wall.

* * * * *